US012713066B2

(12) United States Patent
Hu et al.

(10) Patent No.: US 12,713,066 B2
(45) **Date of Patent: *Aug. 18, 2026**

(54) METHODS AND APPARATUS FOR IMPROVED ENTROPY ENCODING AND DECODING

(71) Applicant: INTERDIGITAL VC HOLDINGS, INC., Wilmington, DE (US)

(72) Inventors: Yang Hu, Troy, NY (US); Joel Sole, San Diego, CA (US); Xiaoan Lu, Princeton, NJ (US); Peng Yin, Ithaca, NY (US); Yunfei Zheng, San Jose, CA (US)

(73) Assignee: INTERDIGITAL VC HOLDINGS, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/745,113

(22) Filed: Jun. 17, 2024

(65) Prior Publication Data

US 2024/0340453 A1 Oct. 10, 2024

Related U.S. Application Data

(63) Continuation of application No. 18/142,635, filed on May 3, 2023, now Pat. No. 12,052,439, which is a (Continued)

(51) Int. Cl.
*H04N 19/60* (2014.01)
*H03M 7/40* (2006.01)
(Continued)

(52) U.S. Cl.
CPC .......... *H04N 19/60* (2014.11); *H03M 7/4006* (2013.01); *H03M 7/4018* (2013.01);
(Continued)

(58) Field of Classification Search
CPC ........ H04N 19/60; H04N 19/13; H04N 19/46; H04N 19/61; H04N 19/70; H04N 19/124;
(Continued)

(56) References Cited

U.S. PATENT DOCUMENTS 6,842,124 B2 1/2005 Penna
9,154,801 B2 10/2015 Sze et al.
(Continued)

FOREIGN PATENT DOCUMENTS

CN 1527610 9/2004
CN 1620819 5/2005
(Continued)

OTHER PUBLICATIONS

ITU-T Recommendation H.264, "Advanced video coding for generic audiovisual services," Series H: Audiovisual and Multimedia Systems, Infrastructure of audiovisual services—Coding of moving video, 343 pages, Mar. 2005.—* cited in parent.
(Continued)

*Primary Examiner* — Tat C Chio
(74) *Attorney, Agent, or Firm* — Ronald Kolczynski

(57) ABSTRACT

Methods and apparatus are provided for improved entropy encoding and decoding. An apparatus includes a video encoder (200) for encoding at least a block in a picture by transforming a residue of the block to obtain transform coefficients, quantizing the transform coefficients to obtain quantized transform coefficients, and entropy coding the quantized transform coefficients. The quantized transform coefficients are encoded using a flag to indicate that a current one of the quantized transform coefficients being processed is a last non-zero coefficient for the block having a value greater than or equal to a specified value.

20 Claims, 16 Drawing Sheets

Related U.S. Application Data continuation of application No. 17/533,235, filed on Nov. 23, 2021, now Pat. No. 11,677,983, which is a continuation of application No. 16/878,689, filed on May 20, 2020, now Pat. No. 11,218,732, which is a continuation of application No. 16/123,219, filed on Sep. 6, 2018, now Pat. No. 10,694,211, which is a continuation of application No. 15/791,470, filed on Oct. 24, 2017, now Pat. No. 10,097,859, which is a continuation of application No. 15/602,482, filed on May 23, 2017, now Pat. No. 9,832,486, which is a continuation of application No. 13/879,378, filed as application No. PCT/US2011/055047 on Oct. 6, 2011, now Pat. No. 9,693,056.

(60) Provisional application No. 61/393,195, filed on Oct. 14, 2010.

(51) Int. Cl.
*H04N 19/13* (2014.01)
*H04N 19/46* (2014.01)
*H04N 19/61* (2014.01)
*H04N 19/70* (2014.01)

(52) U.S. Cl.
CPC ............ *H04N 19/13* (2014.11); *H04N 19/46* (2014.11); *H04N 19/61* (2014.11); *H04N 19/70* (2014.11)

(58) Field of Classification Search
CPC . H04N 19/176; H03M 7/4006; H03M 7/4018
See application file for complete search history.

(56) References Cited

U.S. PATENT DOCUMENTS

| | | | | |
|---|---|---|---|---|
| 9,315,304 | B2 | 4/2016 | Spiegelhoff et al. | |
| 9,693,056 | B2 * | 6/2017 | Hu | H04N 19/70 |
| 9,832,486 | B2 * | 11/2017 | Hu | H03M 7/4006 |
| 10,097,859 | B2 * | 10/2018 | Hu | H03M 7/4018 |
| 10,694,211 | B2 * | 6/2020 | Hu | H04N 19/70 |
| 11,218,732 | B2 * | 1/2022 | Hu | H04N 19/60 |
| 11,677,983 | B2 * | 6/2023 | Hu | H04N 19/61 375/240.18 |
| 12,052,439 | B2 * | 7/2024 | Hu | H04N 19/61 |
| 2007/0036223 | A1 | 2/2007 | Srinivasan | |
| 2007/0110153 | A1 * | 5/2007 | Cho | H04N 19/70 375/E7.199 |
| 2007/0285286 | A1 | 12/2007 | Hussain et al. | |
| 2009/0147843 | A1 * | 6/2009 | Han | H04N 19/126 375/240.03 |
| 2009/0232204 | A1 | 9/2009 | Lee et al. | |
| 2009/0238265 | A1 | 9/2009 | Yoshikawa | |
| 2013/0208806 | A1 | 8/2013 | Hu et al. | |
| 2017/0257643 | A1 | 9/2017 | Hu et al. | |

FOREIGN PATENT DOCUMENTS

| | | |
|---|---|---|
| CN | 101212676 | 7/2008 |
| JP | 201223611 | 2/2012 |
| KR | 20100102701 | 9/2010 |
| WO | WO2008108534 | 9/2008 |

OTHER PUBLICATIONS

Marpe et al., "Context-based Adaptive Binary Arithmetic Coding in the H.264/AVC Video Compression Standard," IEEE Transactions on Circuits and Systems for Video Technology, US, vol. 13, No. 7, Jul. 1, 2003, pp. 620-636.—* cited in parent.

Sugimoto et al., "Proposal on Improved Entropy Coding Method for DCT Coefficients," Joint Collaborative Team on Video Coding (JCT-VC) of ITU-T SG16 WP3 and ISO/IEC JTC1/SC29/WG11, Doc.: JCTVC-B070, Jul. 17, 2010, 8 pages, 2nd Mtg.: Geneva, CH, Jul. 21-28, 2010.—* cited in parent.

Puri et al., "Video Coding Using the H.264/MPEG-4 AVC Compression Standard," Signal Processing Image Communication, Elsevier Science Publishers, Amsterdam, NL, vol. 19, No. 9, Oct. 1, 2004, pp. 793-849.—* cited in parent.

Winken et al., "Video Coding Technology Proposal by Fraunhofer HHI," Joint Collaborative Team on Video Coding (JCT-VC) of ITU-T SG16 WP3 and ISO/IEC JTC1/SC29/WG11, 1st Mtg.: Dresden, DE, Apr. 15-23, 2010, Doc.: JCTVC-A116, Apr. 24, 2010, 44 pages.—* cited in parent.

Search Report Dated: Jan. 24, 2012—* cited in parent.

JCTVC-A205 "Test Model under Consideration" Joint Collaborative Team on Video Coding (JCT-VC) of ITU-T SG16 WP3 and ISO/IEC JTC1/SC29/WG11, 1st Meeting: Dresden, DE, Apr. 15-23, 2010—* cited in parent.

Sole et al., Unified Scans for the Significance Map and Coefficient Level Coding in High Coding Efficiency, JCT-VC of ITU-T SG16 WP3 and ISO/IEC JTC1/SC29/WG11, 5th Meeting, Geneva, CH, Mar. 16-23, 2011—* cited in parent.

Test Model under Consideration, Document: JCTVC-B205, Joint Collaborative Team on Video Coding (JCT-VC) of ITU-T SG16 WP3 and ISO/IEC JTC1/SC29/WG11, 2nd Meeting: Geneva, CH, Jul. 21-28, 2010—*—cited in parent.

* cited by examiner

100

| Coefficients | 10 | 0 | -1 | 2 | 0 | 1 | 0 | -1 | 0... |
|---|---|---|---|---|---|---|---|---|---|
| Sig_flag | 1 | 0 | 1 | 1 | 0 | 1 | 0 | 1 | |
| Last_flag | 0 | | 0 | 0 | | 0 | | 1 | |
| Bin_1 | 0 | | 1 | 0 | | 1 | | 1 | |
| Level | 10-2=8 | | | 2-2=0 | | | | | |
| Sign | 0 | | 1 | 0 | | 0 | | 1 | |

205
Encoder Control
Metadata
200
SEI Inserter
230
210
Input picture
Frame Ordering Buffer
285
+
-
Transform and Quantization
225
Entropy Coding
245
290
235
Output Buffer
Output bit-stream
Picture-Type Decision
215
Inverse Transform and Quantization
250
SPS and PPS Inserter
240
MB-Type Decision
220
219
260
297
Intra prediction
270
Motion Compensation
265
Deblocking Filter
Motion Estimation
275
Reference Picture Buffer
280

300
305
Decoder Control
310
Input Buffer
Input bitstream
345
Entropy Decoding
350
Inverse Transform and Quantization
325
360
Intra prediction
365
Deblocking Filter
Output picture
380
Reference Picture Buffer
370
Motion Compensation
397

400

| 10 | 0 | 1 | 0 |
|---|---|---|---|
| -1 | 0 | -1 | 0 |
| 2 | 0 | 0 | 0 |
| 0 | 0 | 0 | 0 |

| Coefficients | 10 | 0 | -1 | 2 | 0 | 1 | 0 | -1 | 0... |
|---|---|---|---|---|---|---|---|---|---|
| Sig_flag | 1 | 0 | 1 | 1 | 0 | 1 | 0 | 1 | |
| Last_ge2_flag | 0 | | 0 | 1 | | | | | |
| Last_flag | | | | 0 | | 0 | | 1 | |
| Bin_1 | 0 | | 1 | | | | | | |
| Level | 10-2=8 | | | 2-2=0 | | | | | |
| Sign | 0 | | 1 | 0 | | 0 | | 1 | |

METHODS AND APPARATUS FOR IMPROVED ENTROPY ENCODING AND DECODING

CROSS-REFERENCE TO RELATED APPLICATIONS

This application claims the benefit of U.S. Provisional Application Ser. No. 61/393,195, filed Oct. 14, 2010, which is incorporated by reference herein in its entirety.

TECHNICAL FIELD

The present principles relate generally to video encoding and decoding and, more particularly, to methods and apparatus for improved entropy encoding and decoding.

BACKGROUND

Video coding standards employ prediction and block-based transforms to leverage redundancy in intra/inter frame correlation and achieve high compression efficiency. Furthermore, entropy coding makes the coded bit-stream achieve its entropy boundary and further improves the coding efficiency.

An important usage of entropy coding in video coding system is the coding of the quantized transform coefficients of a block, which is the residual data block after intra/inter prediction, block transform, and quantization. For such data, entropy coding tools have been developed, ranging from variable length coding, such as the Huffman coding, to arithmetic coding. The state-of-the-art CABAC (context-adaptive binary arithmetic coding) achieves high coding efficiency, but the non-systematic implementation of the CABAC coding procedure results in two scanning passes being performed to code a data block.

CABAC is the entropy coding method for the quantized transform coefficient block in the International Organization for Standardization/International Electrotechnical Commission (ISO/IEC) Moving Picture Experts Group-4 (MPEG-4) Part 10 Advanced Video Coding (AVC) Standard/International Telecommunication Union, Telecommunication Sector (ITU-T) H.264 Recommendation (hereinafter the "MPEG-4 AVC Standard"). CABAC codes a block in two main passes. In the first pass, CABAC codes the significance map of the block according to a forward zigzag scanning order. In the second pass, CABAC codes the non-zero values in an inverse zigzag scanning order.

Turning to FIG. 1, an example of CABAC coding is indicated generally by the reference numeral 100. In the significance map coding pass, i.e., the first pass, CABAC uses the sig_flag and last_flag to indicate the positions of the non-zero coefficients.

In the inverse zigzag coding of the non-zero values, two sub-coding processes are used. In the first sub-coding process, a syntax called Bin_1 (i.e., the first bin) is used to indicate whether or not a non-zero coefficient has an absolute value of one. If the non-zero coefficient has an absolute value of one, then Bin_1=1 and the sign of the non-zero coefficient is sent out. Otherwise, Bin_1=0 and the encoding moves to the second sub-coding process. In the second sub-coding process, CABAC codes the coefficients which have an absolute value greater than one, corresponding to Bin_1=0, and then sends out their respective signs.

The disadvantage of CABAC is that the corresponding coding involves two scanning passes (i.e., a forward zigzag scan to code the significance map, and an inverse zigzag scan to code values). In addition, the design of CABAC is mainly for smaller block sizes (e.g., 4×4 and 8×8). CABAC turns out to be less efficient for larger blocks (e.g., 16×16, 32×32, and 64×64).

One prior art approach proposes adding a flag to signal the last position of a discrete cosine transform (DCT) coefficient greater than one. However, the prior art approach is restricted to a flag greater than one and still uses two scanning passes.

SUMMARY

These and other drawbacks and disadvantages of the prior art are addressed by the present principles, which are directed to methods and apparatus for improved entropy encoding and decoding.

According to an aspect of the present principles, there is provided an apparatus. The apparatus includes a video encoder for encoding at least a block in a picture by transforming a residue of the block to obtain transform coefficients, quantizing the transform coefficients to obtain quantized transform coefficients, and entropy coding the quantized transform coefficients. The quantized transform coefficients are encoded using a flag to indicate that a current one of the quantized transform coefficients being processed is a last non-zero coefficient for the block having a value greater than or equal to a specified value.

According to another aspect of the present principles, there is provided a method in a video encoder. The method includes encoding at least a block in a picture by transforming a residue of the block to obtain transform coefficients, quantizing the transform coefficients to obtain quantized transform coefficients, and entropy coding the quantized transform coefficients. The quantized transform coefficients are encoded using a flag to indicate that a current one of the quantized transform coefficients being processed is a last non-zero coefficient for the block having a value greater than or equal to a specified value.

According to yet another aspect of the present principles, there is provided an apparatus. The apparatus includes a video decoder for decoding at least a block in a picture by entropy decoding quantized transform coefficients, de-quantizing the quantized transform coefficients to obtain transform coefficients, and inverse transforming the transform coefficients to obtain a reconstructed residue of the block for use in reconstructing the block. The quantized transform coefficients are decoded using a flag to indicate that a current one of the quantized transform coefficients being processed is a last non-zero coefficient for the block having a value greater than or equal to a specified value.

According to still another aspect of the present principles, there is provided a method in a video decoder. The method includes decoding at least a block in a picture by entropy decoding quantized transform coefficients, de-quantizing the quantized transform coefficients to obtain transform coefficients, and inverse transforming the transform coefficients to obtain a reconstructed residue of the block for use in reconstructing the block. The quantized transform coefficients are decoded using a flag to indicate that a current one of the quantized transform coefficients being processed is a last non-zero coefficient for the block having a value greater than or equal to a specified value.

These and other aspects, features and advantages of the present principles will become apparent from the following detailed description of exemplary embodiments, which is to be read in connection with the accompanying drawings.

BRIEF DESCRIPTION OF THE DRAWINGS

The present principles may be better understood in accordance with the following exemplary figures, in which:

FIG. 4 is a diagram showing an exemplary quantized transform block of size 4×4, in accordance with an embodiment of the present principles;

DETAILED DESCRIPTION

Figure 1:
FIG. 1 is a diagram showing an example of CABAC coding, in accordance with the prior art.

The present principles are directed to methods and apparatus for improved entropy encoding and decoding.

The present description illustrates the present principles. It will thus be appreciated that those skilled in the art will be able to devise various arrangements that, although not explicitly described or shown herein, embody the present principles and are included within its spirit and scope.

All examples and conditional language recited herein are intended for pedagogical purposes to aid the reader in understanding the present principles and the concepts contributed by the inventor(s) to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the present principles. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The present principles as defined by such claims reside in the fact that the functionalities provided by the various recited means are combined and brought together in the manner which the claims call for. It is thus regarded that any means that can provide those functionalities are equivalent to those shown herein.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Also, as used herein, the words "picture" and "image" are used interchangeably and refer to a still image or a picture from a video sequence. As is known, a picture may be a frame or a field.

Figure 2:
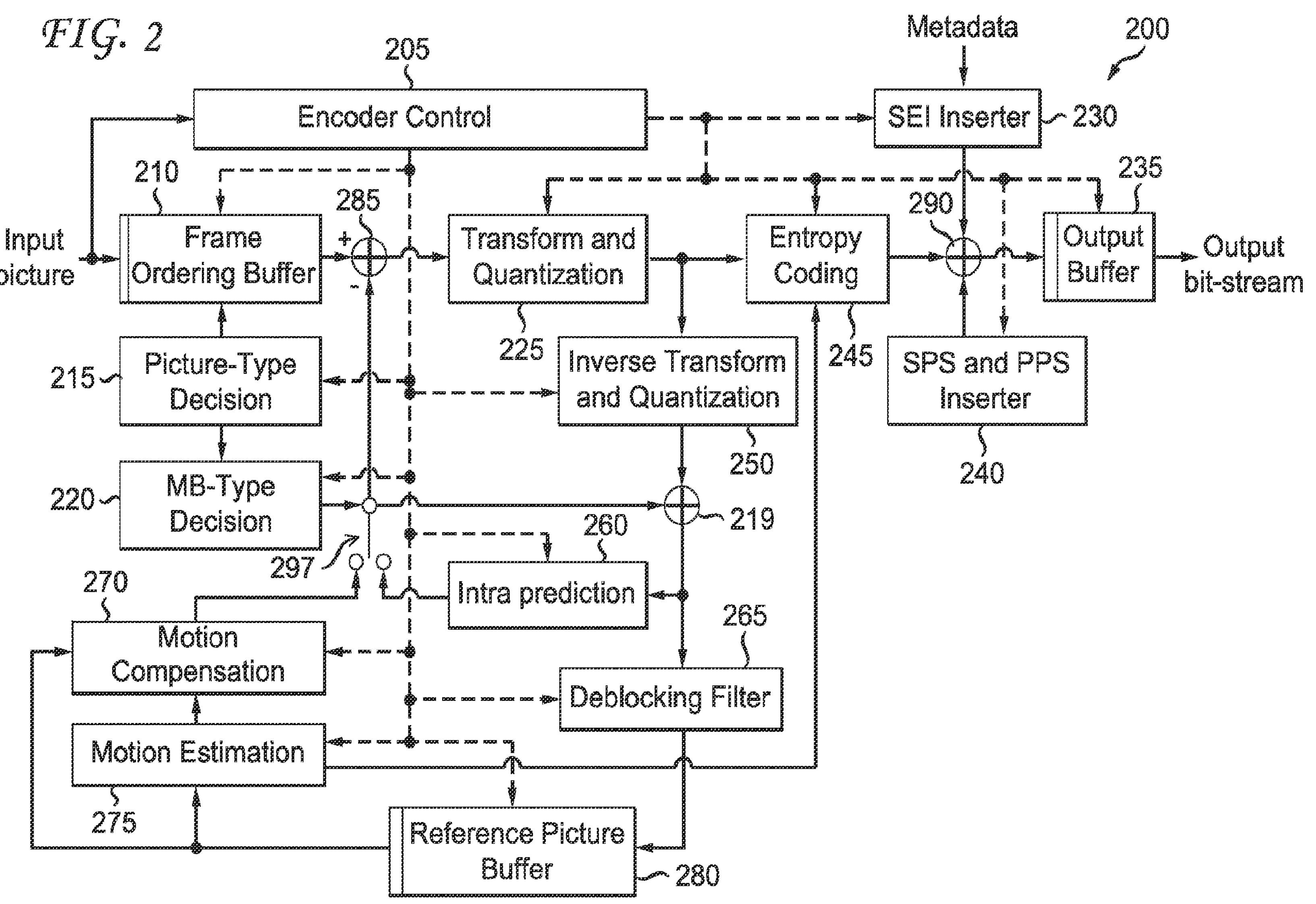
FIG. 2 is a block diagram showing an exemplary video encoder to which the present principles may be applied, in accordance with an embodiment of the present principles.

Turning to FIG. 2, an exemplary video encoder to which the present principles may be applied is indicated generally by the reference numeral 200. The video encoder 200 includes a frame ordering buffer 210 having an output in signal communication with a non-inverting input of a combiner 285. An output of the combiner 285 is connected in signal communication with a first input of a transformer and quantizer 225. An output of the transformer and quantizer 225 is connected in signal communication with a first input of an entropy coder 245 and a first input of an inverse transformer and inverse quantizer 250. An output of the entropy coder 245 is connected in signal communication with a first non-inverting input of a combiner 290. An output of the combiner 290 is connected in signal communication with a first input of an output buffer 235.

A first output of an encoder controller 205 is connected in signal communication with a second input of the frame ordering buffer 210, a second input of the inverse transformer and inverse quantizer 250, an input of a picture-type decision module 215, a first input of a macroblock-type (MB-type) decision module 220, a second input of an intra prediction module 260, a second input of a deblocking filter 265, a first input of a motion compensator 270, a first input of a motion estimator 275, and a second input of a reference picture buffer 280.

A second output of the encoder controller 205 is connected in signal communication with a first input of a Supplemental Enhancement Information (SEI) inserter 230, a second input of the transformer and quantizer 225, a second input of the entropy coder 245, a second input of the output buffer 235, and an input of the Sequence Parameter Set (SPS) and Picture Parameter Set (PPS) inserter 240.

An output of the SEI inserter 230 is connected in signal communication with a second non-inverting input of the combiner 290.

A first output of the picture-type decision module 215 is connected in signal communication with a third input of the frame ordering buffer 210. A second output of the picture-type decision module 215 is connected in signal communication with a second input of a macroblock-type decision module 220.

An output of the Sequence Parameter Set (SPS) and Picture Parameter Set (PPS) inserter 240 is connected in signal communication with a third non-inverting input of the combiner 290.

An output of the inverse quantizer and inverse transformer 250 is connected in signal communication with a first non-inverting input of a combiner 219. An output of the combiner 219 is connected in signal communication with a first input of the intra prediction module 260 and a first input of the deblocking filter 265. An output of the deblocking filter 265 is connected in signal communication with a first input of a reference picture buffer 280. An output of the reference picture buffer 180 is connected in signal communication with a second input of the motion estimator 275 and a third input of the motion compensator 270. A first output of the motion estimator 275 is connected in signal communication with a second input of the motion compensator 270. A second output of the motion estimator 275 is connected in signal communication with a third input of the entropy coder 245.

An output of the motion compensator 270 is connected in signal communication with a first input of a switch 297. An output of the intra prediction module 260 is connected in signal communication with a second input of the switch 297. An output of the macroblock-type decision module 220 is connected in signal communication with a third input of the switch 297. The third input of the switch 297 determines whether or not the "data" input of the switch (as compared to the control input, i.e., the third input) is to be provided by the motion compensator 270 or the intra prediction module 260. The output of the switch 297 is connected in signal communication with a second non-inverting input of the combiner 219 and an inverting input of the combiner 285.

A first input of the frame ordering buffer 210 and an input of the encoder controller 205 are available as inputs of the encoder 200, for receiving an input picture. Moreover, a second input of the Supplemental Enhancement Information (SEI) inserter 230 is available as an input of the encoder 200, for receiving metadata. An output of the output buffer 235 is available as an output of the encoder 200, for outputting a bitstream.

Figure 3:
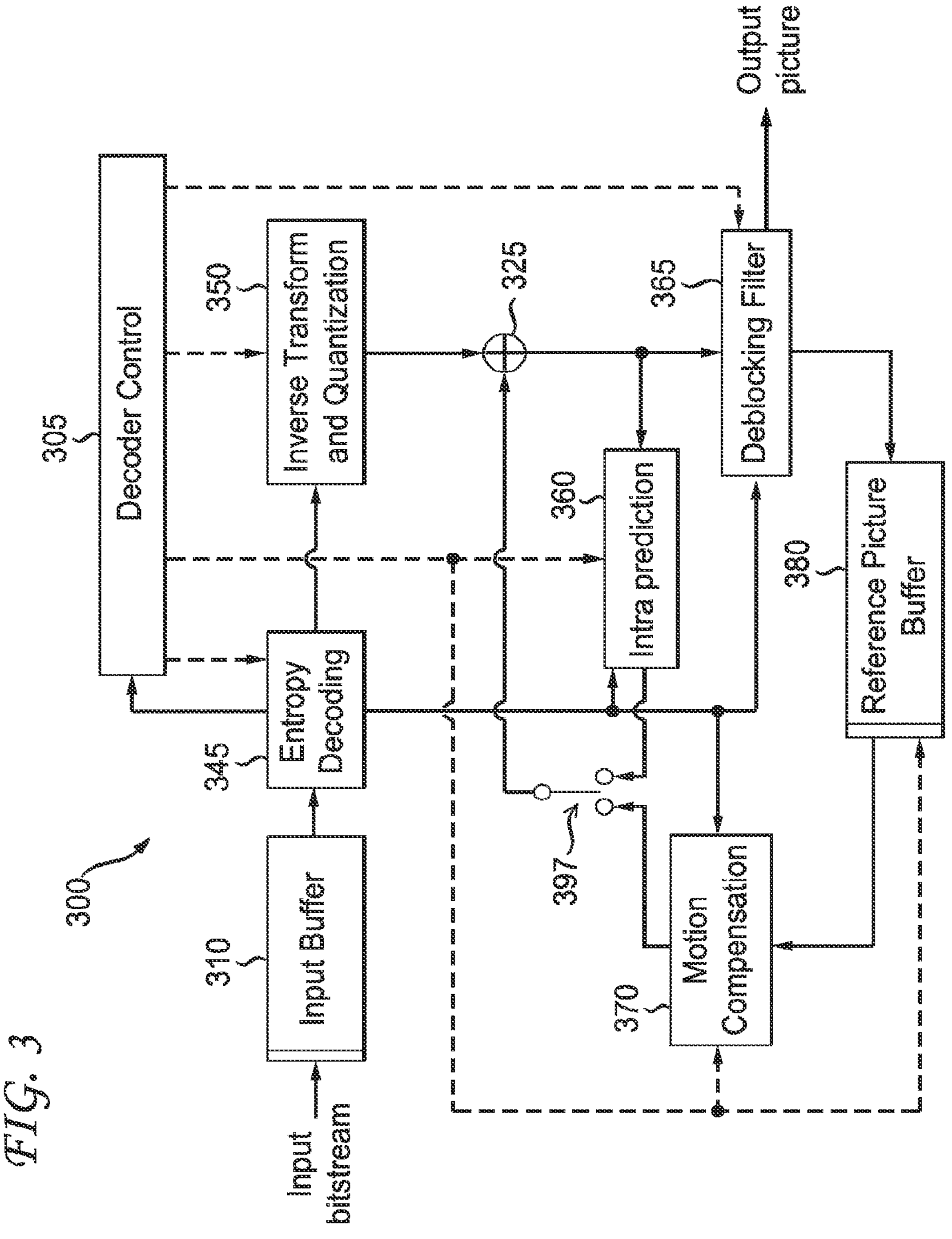
FIG. 3 is a block diagram showing an exemplary video decoder to which the present principles may be applied, in accordance with an embodiment of the present principles.

Turning to FIG. 3, an exemplary video decoder to which the present principles may be applied is indicated generally by the reference numeral 300. The video decoder 300 includes an input buffer 310 having an output connected in signal communication with a first input of an entropy decoder 345. A first output of the entropy decoder 345 is connected in signal communication with a first input of an inverse transformer and inverse quantizer 350. An output of the inverse transformer and inverse quantizer 350 is connected in signal communication with a second non-inverting input of a combiner 325. An output of the combiner 325 is connected in signal communication with a second input of a deblocking filter 365 and a first input of an intra prediction module 360. A second output of the deblocking filter 365 is connected in signal communication with a first input of a reference picture buffer 380. An output of the reference picture buffer 380 is connected in signal communication with a second input of a motion compensator 370.

A second output of the entropy decoder 345 is connected in signal communication with a third input of the motion compensator 370, a first input of the deblocking filter 365, and a third input of the intra predictor 360. A third output of the entropy decoder 345 is connected in signal communication with an input of a decoder controller 305. A first output of the decoder controller 305 is connected in signal communication with a second input of the entropy decoder 345. A second output of the decoder controller 305 is connected in signal communication with a second input of the inverse transformer and inverse quantizer 350. A third output of the decoder controller 305 is connected in signal communication with a third input of the deblocking filter 365. A fourth output of the decoder controller 305 is connected in signal communication with a second input of the intra prediction module 360, a first input of the motion compensator 370, and a second input of the reference picture buffer 380.

An output of the motion compensator 370 is connected in signal communication with a first input of a switch 397. An output of the intra prediction module 360 is connected in signal communication with a second input of the switch 397. An output of the switch 397 is connected in signal communication with a first non-inverting input of the combiner 325.

An input of the input buffer 310 is available as an input of the decoder 300, for receiving an input bitstream. A first output of the deblocking filter 365 is available as an output of the decoder 300, for outputting an output picture.

As noted above, the present principles are directed to methods and apparatus for improved video encoding and decoding. Advantageously, the present principles overcome the non-systematic weakness of CABAC. The present principles also use a binary arithmetic coding engine, but with a systematic coding procedure that saves binary bins, which reduces the use of the binary arithmetic coding engine in both the encoder and the decoder. With this systematic coding method and the reduced binary bins, a simpler coding system and higher compression efficiency is achieved over prior art CABAC systems.

Thus, the present principles are directed to the systematic entropy coding of coefficient blocks with less syntax bins. Systematically, we code the coefficient value when the coefficient value is found (or processed) in a given scanning order. Specifically, we use a "significance flag" (sig_flag) to indicate the zero and non-zero coefficients. For non-zero, we use the "last coefficient greater or equal to 2" (last_ge2_flag) and "last flag" (last_flag) to indicate whether or not the left set of positions includes a number of non-zero coefficients "greater or equal to 2" (ge2) and significant coefficients, respectively. Whenever a significant coefficient is found or indicated by the sig_flag (sig_flag=1), its value is coded immediately. There are at least three benefits to the approach of the present principles:

(1) The whole block is coded in one scan, which makes the system simpler.

(2) Binary bins are reduced and thus some binary arithmetic coding operations are saved at the encoder and the decoder.

(3) Level information of neighboring coded coefficients is available to design the context models for the syntax such as sig_flag, last_flag, last_ge2_flag, and the level bins.

Thus, the entropy coding system disclosed and described is a simpler and more efficient entropy coding system than prior art systems.

In a video coding system, the raw data is processed with intra or inter prediction to remove intra or inter frame correlation, and then processed with a block-based transform such as the 4×4, 8×8, 16×16, 32×32, and 64×64 DCT (or some other transform) to further remove the correlation. Then quantization is applied to the coefficients in the transform blocks. In an embodiment, entropy coding is performed last to code the quantized coefficients of each transformed block in order to provide the same for the output bitstream.

Turning to FIG. 4, an exemplary quantized transform block of size 4×4 is indicated generally by the reference numeral 400. After prediction, transformation, and quantization, most of the energy of a block is concentrated in the low frequency positions (which lie in the top-left corner of a transform block) while most of the high frequency coefficients (which lie in the bottom-right corner of the block) are zeros. To entropy code such a data block, we need to express the block information including the coefficient values and their positions inside the block efficiently with binary bins. Then, the binary bins are coded with a binary arithmetic coding engine.

To express the block information with binary bins, we use the following syntaxes. For purposes of ease of description, some of syntax elements are borrowed from existing methods, such as CABAC. Additionally, new syntax elements are introduced to enable the present principles as follows:

Sig_flag: It is defined the same as in CABAC. Sig_flag=1 means a corresponding coefficient is non-zero (significant). Sig_flag=0 means a corresponding coefficient is zero.

Last_ge2_flag: It is a new syntax element introduced in accordance with the present principles for indicating whether or not the current non-zero coefficient is the last coefficient with an absolute value larger than one in the current block by the given scanning order. The expression "ge2" comes from "Greater or Equal to 2". Last_ge2_flag=1 means the current non-zero coefficient is the last such coefficient. Last_ge2_flag=0 means the current non-zero coefficient is not the last such coefficient.

Last_flag: It is defined the same as in CABAC. Last_flag means whether or not the current non-zero coefficient is the last one in the current block in the given scanning order. Last_flag=1 means the current non-zero coefficient is the last such one. Last_flag=0 means the current non-zero coefficient is not the last such one.

Bin_1: When a coefficient is known to be non-zero, but not known to be one or larger than one (ge2) in terms of its absolute value, a bin_1 is sent out to clarify it. Bin_1=1 means the non-zero coefficient has an absolute value of one. Bin_1=0 means the non-zero coefficient has an absolute value greater than one (ge2). Note that we use Bin_1 to indicate that a coefficient has an absolute value of one or larger than one, instead of coding this information as other coefficient values, such as 2, 3, or larger. This is because in a typical data block, about half of the non-zeros have an absolute value of one, so it is more efficient to process them specially.

Level: When a coefficient is known to have an absolute value larger than one (ge2), we send out its level which is the absolute value. Originally, this level is not binary, so we use some binarization method such as, for example, but not limited to, the UEG0 method used in CABAC to binarize them and then we code these binary bins with binary arithmetic coding.

Sign: For every non-zero coefficient, the sign is sent out as 0 or 1 for "+" and "−", respectively.

Figures 5, 6:
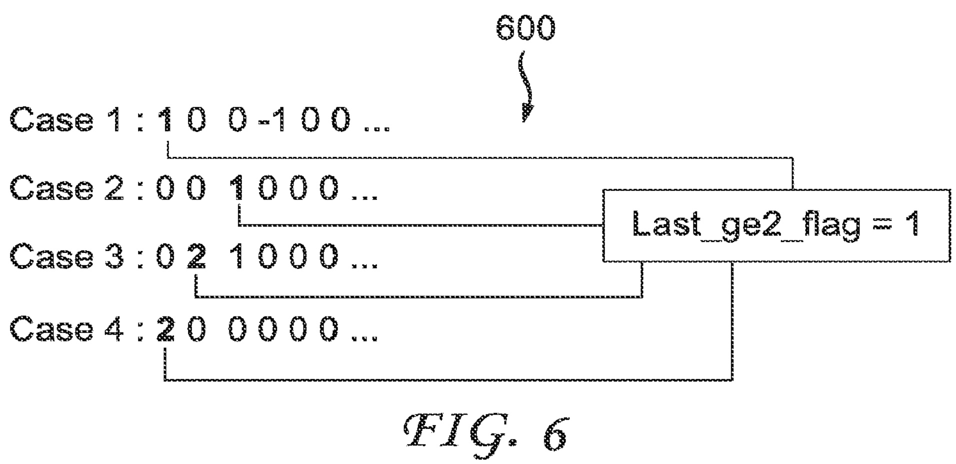
FIG. 5 is a diagram showing an example of a coding process, in accordance with an embodiment of the present principles.
FIG. 6 is a diagram showing exemplary special cases where Bin_1 is not saved, in accordance with an embodiment of the present principles.

Turning to FIG. 5, an example of a coding process is indicated generally by the reference numeral 500. The coding process 500 is described with respect to the coding of the example block 400 in FIG. 4. We scan the data in a given scanning order, for example, the forward zigzag scan in CABAC. The rearranged coefficients are given in the first row of FIG. 5.

For the first coefficient "10", it is non-zero (sig_flag=1) and not the last ge2 (last_ge2_flag=0). To code its value, first send out Bin_1=0 to indicate its absolute value is greater than one. Then code its absolute value with level. Here only code 10−2=8, and the decoder knows that the absolute value should be 8+2=10. Finally, send out its sign "+" with 0.

For the second coefficient "0", sig_flag=0. Then all information about this coefficient has been sent out, and the encoder moves to process the next coefficient.

The next coefficient "−1", it is non-zero (sig_flag=1) and not the last ge2 (last_ge2_flag=0). To code its value, send out Bin_1=1 to indicate its absolute value is one, and then there is no need to process level. Finally, send out its sign "−" with 1.

The next coefficient "2", it is non-zero (sig_flag=1) and is the last ge2 (last_ge2_flag=1). After last_ge2_flag=1, we need to send out last_flag to indicate whether or not the current coefficient is the last non-zero coefficient. Here, it is not the last non-zero coefficient, so last_flag=0. Note that the last_ge2_flag=1 here indicates implicitly that this coefficient must have an absolute value larger than 1 (i.e., it must be a ge2), so the Bin_1=0 is saved. We send out its absolute value with level by coding 2−2=0, and then the decoder knows the absolute value is 0+2=2. Finally, send out its sign "+" with 0.

For the next coefficient "0", sig_flag=0.

The next coefficient "1", it is non-zero (sig_flag=1) and not the last non-zero coefficient (last_flag=0). After last_ge2_flag=1, all the significant coefficients must have an absolute value of one, so we need not code its absolute value with Bin_1 or level any more. We only send out its sign "+" with 0.

For the next coefficient "0", sig_flag=0.

The next coefficient "−1", it is non-zero (sig_flag=1) and is the last non-zero (last_flag=1). After we send out its sign "−" with 1, the coding of this block is complete.

From the above coding example, we see that at least one novel aspect of the described embodiment is the use of the last_ge2_flag. There are several advantages of last_ge2_flag, including at least the following:

1. Last_ge2_flag saves some last_flag. If last_ge2_flag=0, there must be non-zero (specifically greater than one) coefficients in the following scanning positions. Then the last_flag must be 0, so we save these last_flag's until last_ge2_flag=1.

Compare coding the same example block with CABAC and the proposed method. In FIG. 1, coding the block with CABAC requires 5 last_flags, which are 00001, while in FIG. 5, coding the same block with the new method requires 3 last_ge2_flags (001) and 3 last_flags (001). Presuming N non-zero coefficients in a block, CABAC requires N last_flags, while the new method requires in total N+1 last_ge2_flags and last_flags. Compared with the next two savings by last_ge2_flag, this one extra flag here is quite worthwhile.

2. At the end of the scanning path it is very likely to observe the occurrence of successive so-called trailing ones, i.e., transform coefficient levels with an absolute value equal to one. For the example in FIG. 5, there are five significant coefficients: 10, −1, 2, 1, −1, and "1" and "−1" at the end are trailing ones. Last_ge2_flag saves Bin_1's for trailing ones in CABAC. After last_ge2_flag=1, if some coefficients are indicated to be non-zeros, then they must have an absolute value of one. They are actually the trailing ones in the CABAC coding. In CABAC, each such trailing one needs one Bin_1 to indicate it is one (instead of ge2). Since we indicate them implicitly with last_ge2_flag=1, the Bin_1's for the trailing ones are saved here. In large transform blocks, there is a comparatively large number of trailing ones, so the saving here is significant.

3. Last_ge2_flag saves other Bin_1 for non-trailing ones. When the last_ge2_flag turns from 0 to 1 at some coefficient, the coefficient must be a ge2 (i.e., the coefficient has an absolute value greater than one), so there is no need to send out the Bin_1, which must be 0. An example is the coefficient 2 of the coding example in FIG. 1.

Such a saving in Bin_1 only exists in the block where last_ge2_flag turns from 0 to 1. That is, there are more than one last_ge2_flags sent out for the block. Presuming only one last_ge2_flag is sent out for a block, it must be 1, and the corresponding coefficient could have an absolute value of one or ge2. Some example cases are provided in FIG. 6, where the coefficients are arranged in some given scanning order.

Turning to FIG. 6, exemplary special cases where Bin_1 is not saved are indicated generally by the reference numeral 600. Moreover, we note that there are four special cases, and each is respectively indicated as Case 1, Case 2, Case 3, and Case 4. In Cases 1 and 2, the absolute values of all significant coefficients are smaller than 2. In Cases 3 and 4, only the first significant coefficient has an absolute value of greater than 1. In all cases, last_ge2_flag is set to 1 at the first significant coefficient, so there is no "turning from 0 to 1" for the last_ge2_flag and only one bin is used for the last_ge2_flag. Hence, the coefficient with last_ge2_flag=1 could be 1 (as in Case 1 and Case 2) or greater than 1 (as in Case 3 and Case 4), which should be indicated by Bin_1. In Case 1 and Case 2, the first significant coefficient "1" has last_ge2_flag=1 and Bin_1=1. In Case 3 and Case 4, the first significant coefficient 2 (or more generally greater than or equal to 2) has last_ge2_flag=1 and Bin_1=0. That is, when the last_ge2_flag for a block includes only one bin, which must be 1, the corresponding Bin_1 needs to be encoded.

Figure 7A:
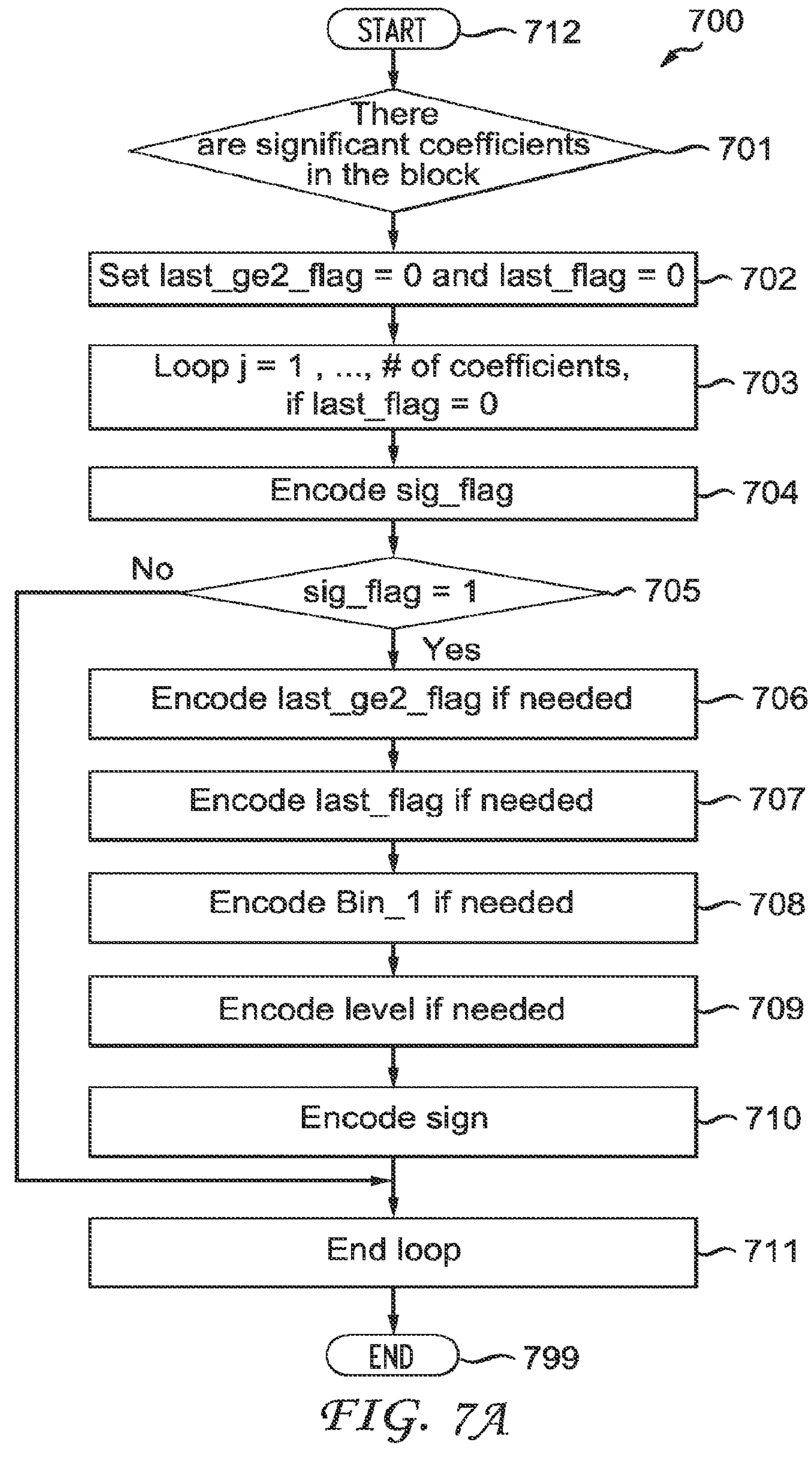
FIG. 7A is a flow diagram showing an exemplary method for entropy encoding, in accordance with an embodiment of the present principles.

Turning to FIG. 7A, an exemplary method for entropy encoding is indicated generally by the reference numeral 700. The method includes a start block 712 that passes control to a decision block 701. The decision block 701 determines whether or not there are significant coefficients in the block. If so, then control is passed to a function block 702. Otherwise, control is passed to an end block 799. The function block 702 sets last_ge2_flag=0 nd last_flag=0, and passes control to a function block 703. The function block 703 begins a loop using a variable j having a range from 1 to the number (#) of coefficients, if last_flag=0, and passes control to a function block 704. The function block 704 encodes sig_flag, and passes control to a decision block 705. The decision block 705 determines whether or not sig_flag=1. If so, then control is passed to a function block 706. Otherwise, control is passed to a loop limit block 711. The function block 706 encodes last_ge2_flag if needed, and passes control to a function block 707. The function block 707 encodes last_flag if needed, and passes control to a function block 708. The function block 708 encodes Bin_1 if needed, and passes control to a function block 709. The function block 709 encodes the level if needed, and passes control to a function block 710. The function block 710 encodes the sign, and passes control to the loop limit block 711. The loop limit block 711 ends the loop, and passes control to an end block 799.

Regarding the function block 703, we loop for the coefficients in the block in some scanning order. There is no need to loop for the coefficients after the coefficient with last_flag=1. Regarding the decision block 705, if sig_flag=1 (significant), then we further code the coefficient by the blocks 706-710. Otherwise, we loop for the next coefficient. Regarding the function block 706, the same deals with last_ge2_flag, noting that processing of last_ge2_flag is further described with respect to FIG. 7B. Regarding the function block 707, the same deals with last_flag, noting that processing of last_flag is further described with respect to FIG. 7C. Regarding the function block 708, the same deals with Bin_1, noting that processing of Bin_1 is further described with respect to FIG. 7D. Regarding the function block 709, the same deals with level, noting that processing of level is further described with respect to FIG. 7E.

Figure 7B:
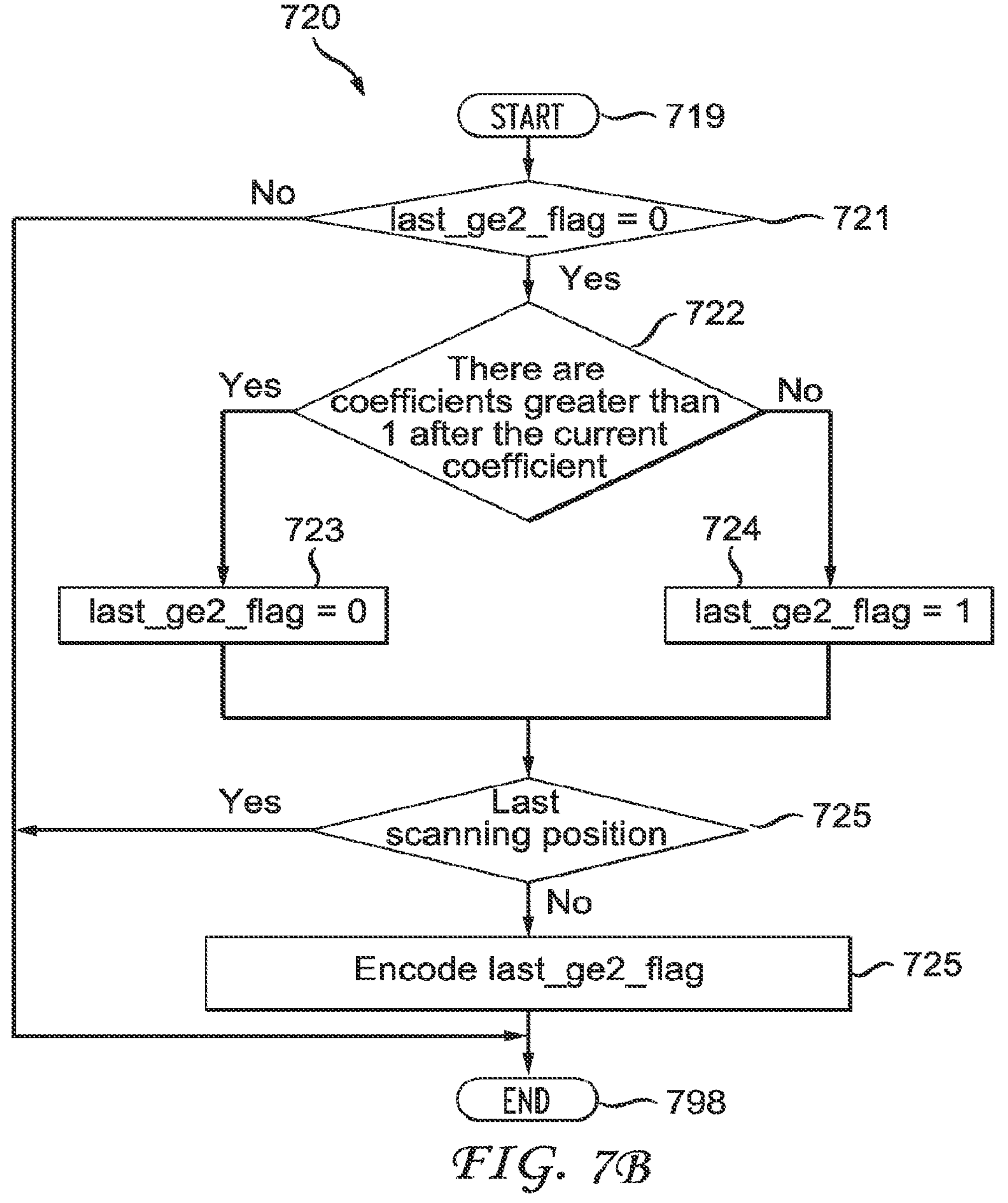
FIG. 7B is a flow diagram showing an exemplary method for encoding last_ge2_flag, in accordance with an embodiment of the present principles.

Turning to FIG. 7B, an exemplary method for encoding last_ge2_flag is indicated generally by the reference numeral 720. The method 720 includes a start block 719 that passes control to a decision block 721. The decision block 721 determines whether or not last_ge2_flag=0. If so, then control is passed to a decision block 722. Otherwise, control is passed to an end block 798. The decision block 722 determines whether or not there are coefficients greater than 1 after the current coefficient. If so, then control is passed to a function block 723. Otherwise, control is passed to a function block 724. The function block 723 sets last_ge2_flag=0, and passes control to a decision block 725. The decision block 724 sets last_ge2_flag=1, and passes control to the decision block 725. The decision block 725 determines whether or not the current scanning position is the last scanning position. If so, then control is passed to the end block 798. Otherwise, control is passed to a function block 726. The function block 726 encodes last_ge2_flag, and passes control to the end block 798.

Figure 7C:
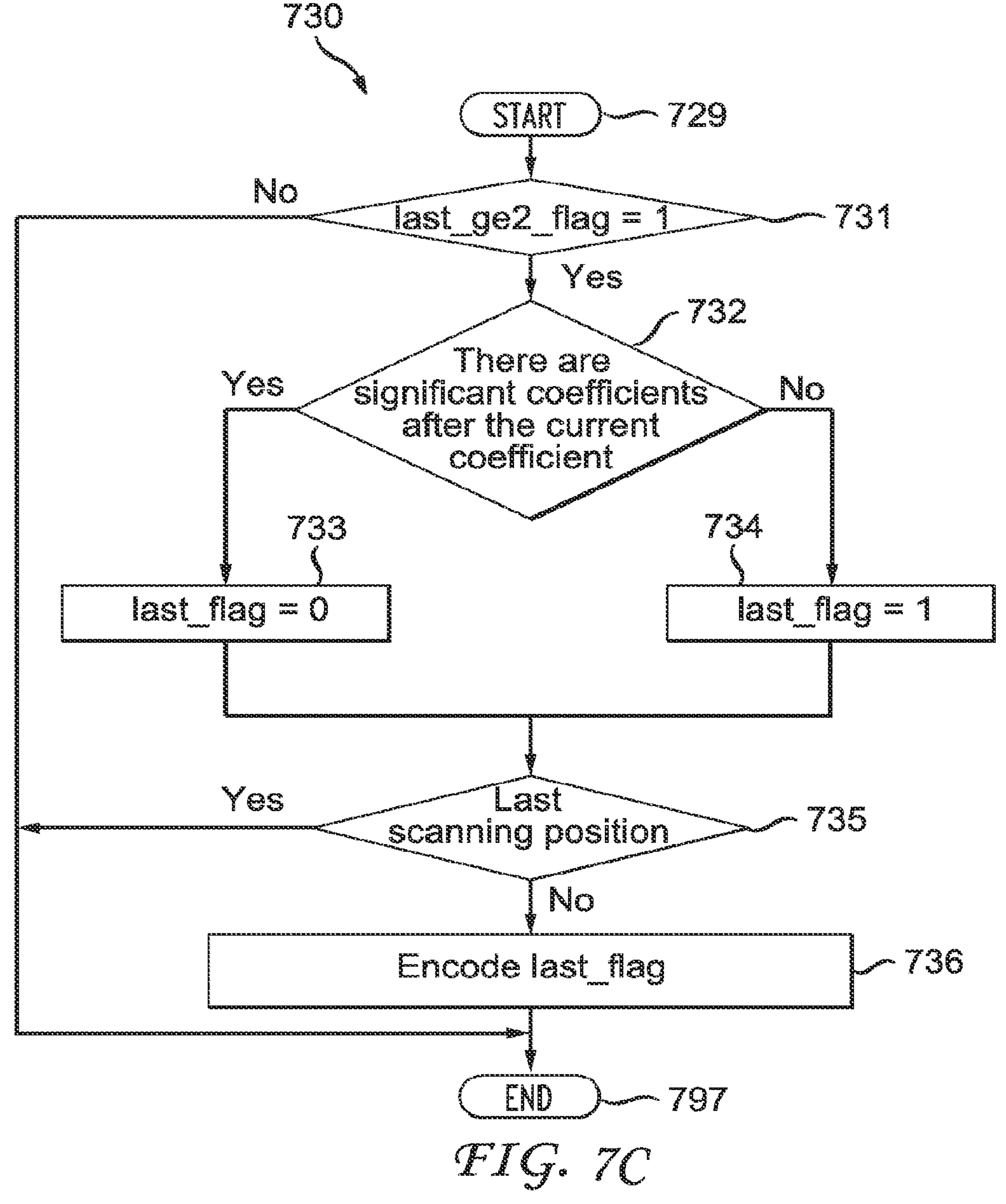
FIG. 7C is a flow diagram showing an exemplary method for encoding last_flag, in accordance with an embodiment of the present principles.

Turning to FIG. 7C, an exemplary method for encoding last_flag is indicated generally by the reference numeral 730. The method includes a start block 729 that passes control to a decision block 731. The decision block 731 determines whether or not last_ge2_flag=1. If so, then control is passed to a decision block 732. Otherwise, control is passed to an end block 797. The decision block 732 determines whether or not there are significant coefficients after the current coefficient. If so, then control is passed to a function block 733. Otherwise, control is passed to a function block 734. The function block 733 sets last_flag=0, and passes control to a decision block 735. The function block 734 sets last_flag=1, and passes control to the decision block 735. The decision block 735 determines whether or not the current scanning position is the last scanning position. If so, then control is passed to the end block 797. Otherwise, control is passed to a function block 736. The function block 736 encodes last_flag, and passes control to the end block 797.

Figure 7D:
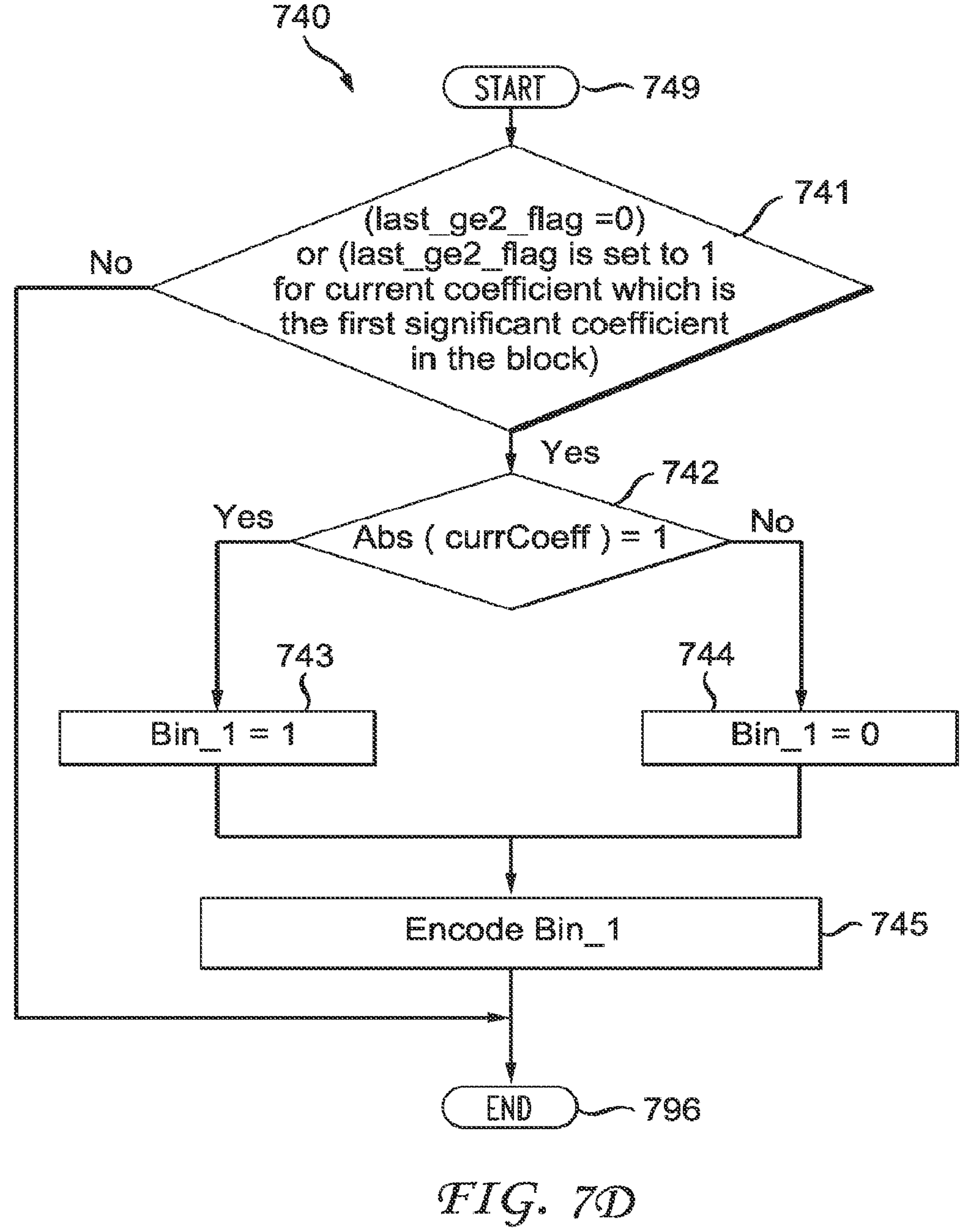
FIG. 7D is a flow diagram showing an exemplary method for encoding Bin_1, in accordance with an embodiment of the present principles.

Turning to FIG. 7D, an exemplary method for encoding Bin_1 is indicated generally by the reference numeral 740. The method 740 includes a start block 739 that passes control to a decision block 741. The decision block 741 determines whether or not (last_ge2_flag=0) or (last_ge2_flag=1 for the current coefficient which is the first significant coefficient in the block). If so, then control is passed to a decision block 742. Otherwise, control is passed to an end block 796. The decision block 742 determines whether or not the absolute value of the transform coefficient is one (Abs(currCoeff)=1). If so, then control is passed to a function block 743. Otherwise, control is passed to a function block 744. The function block 743 sets Bin_1=1, and passes control to a function block 745. The function block 744 sets Bin_1=0, and passes control to the function block 745. The function block 745 encodes Bin_1, and passes control to an end block 796.

Figure 7E:
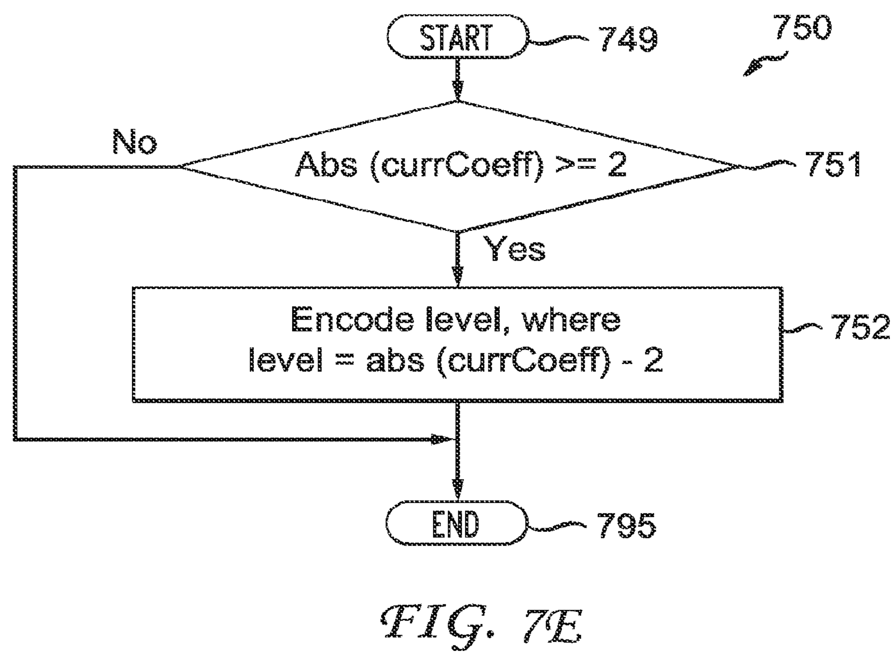
FIG. 7E is a flow diagram showing an exemplary method for encoding level, in accordance with an embodiment of the present principles.

Turning to FIG. 7E, an exemplary method for encoding level is indicated generally by the reference numeral 750. The method 750 includes a start block 749 that passes control to a decision block 751. The decision block 751 determines whether or not the absolute value of the transform coefficient is greater or equal to 2 (Abs(currCoeff)>=2). If so, then control is passed to a function block 752. Otherwise, control is passed to an end block 795. The function block 752 encodes level, where level=abs (currCoeff)−2, and passes control to the end block 795.

The coding order in method 700 is the same as the coding order of the example in FIG. 5. However, the coding order could be flexible for blocks 706-710 as far as satisfying the following rules:

- Last_ge2_flag (per the function block 706) is processed before Bin_1 (per function block 708), and Bin_1 (per the function block 708) is processed before level (per function block 709). That is 706→708→709.
- The processing of last_flag (per the function block 707) could follow function blocks 706, 708, or 709.
- The processing of sign (per the function block 710) could be done before or after any of the four function blocks 706, 707, 708, 709.
- The processing order in the decoder must match that in the encoder.

Note there is special handling when encoding the coefficient in the last scanning position in the block.

- In the method 720, if the last_ge2_flag is still 0 before the last coefficient, then last_ge2_flag must be 1 for the last coefficient, so last_ge2_flag need not be encoded.
- In the method 730, similarly, if the last_flag is still 0 before the last coefficient, then last_flag must be 1 for the last coefficient, so last_flag need not be encoded.
- Bin_1 (740): Regarding the function block 741, if the last_ge2_flag is set to 1 by the function block 724 for the last coefficient (even though it needs not be encoded and sent out by the function block 726) and it is the first significant coefficient in the block, then Bin_1 should be tested and encoded as per blocks 742-745.
- Level information (as per the function block 709) should be encoded if needed.

Figure 8A:
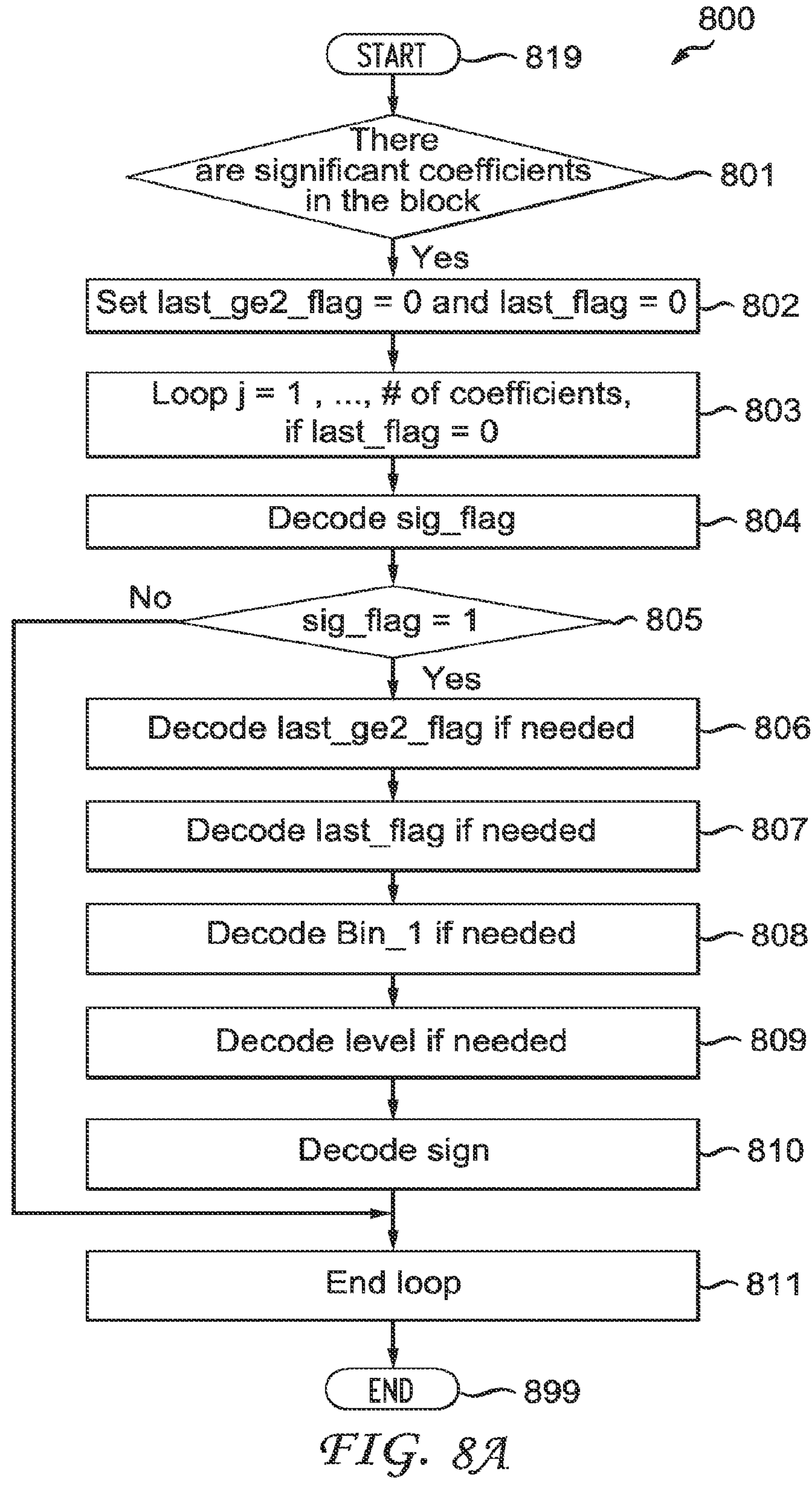
FIG. 8A is a flow diagram showing an exemplary method for entropy decoding, in accordance with an embodiment of the present principles.

Turning to FIG. 8A, an exemplary method for entropy decoding is indicated generally by the reference numeral 800. The method 800 includes a start block 819 that passes control to a decision block 801. The decision block 801 determines whether or not there are significant coefficients in the block. If so, then control is passed to a function block 802. Otherwise, control is passed to an end block 899. The function block 802 sets last_ge2_flag=0 and last_flag=0, and passes control to a function block 803. The function block 803 begins a loop using a variable j having a range from 1 to the number (#) of coefficients if last_flag=0, and passes control to a function block 804. The function block 804 decodes sig_flag, and passes control to a decision block 805. The decision block 805 determines whether or not sig_flag=1. If so, then control is passed to a function block 806. Otherwise, control is passed to a loop limit block 811. The function block 806 decodes last_ge2_flag if needed, and passes control to a function block 807. The function block 807 decodes last_flag if needed, and passes control to a function block 808. The function block 808 decodes Bin_1 if needed, and passes control to a function block 809. The function block 809 decodes level if needed, and passes control to a function block 810. The function block 810 decodes the sign, and passes control to the loop limit block 811. The function block 811 ends the loop, and passes control to the end block 899.

Regarding the function block 803, we loop for the coefficients in the block in the same scanning order as the encoder. There is no need to loop for the coefficients after the coefficient with last_flag=1. Regarding the function block 806, the same deals with last_ge2_flag, noting that processing of last_ge2_flag is further described with respect to FIG. 8B. Regarding the function block 807, the same deals with last_flag, noting that processing of last_flag is further described with respect to FIG. 8C. Regarding the function block 808, the same deals with Bin_1, noting that processing of Bin_1 is further described with respect to FIG. 8D. Regarding the function block 809, the same deals with level, noting that processing of level is further described with respect to FIG. 8E.

It is to be appreciated that in one embodiment, the decoding order of method 800 matches the encoding order of method 700. However, the decoding order could be flexible for function blocks 806-810 as far as matching the encoding order with respect thereto.

Figure 8B:
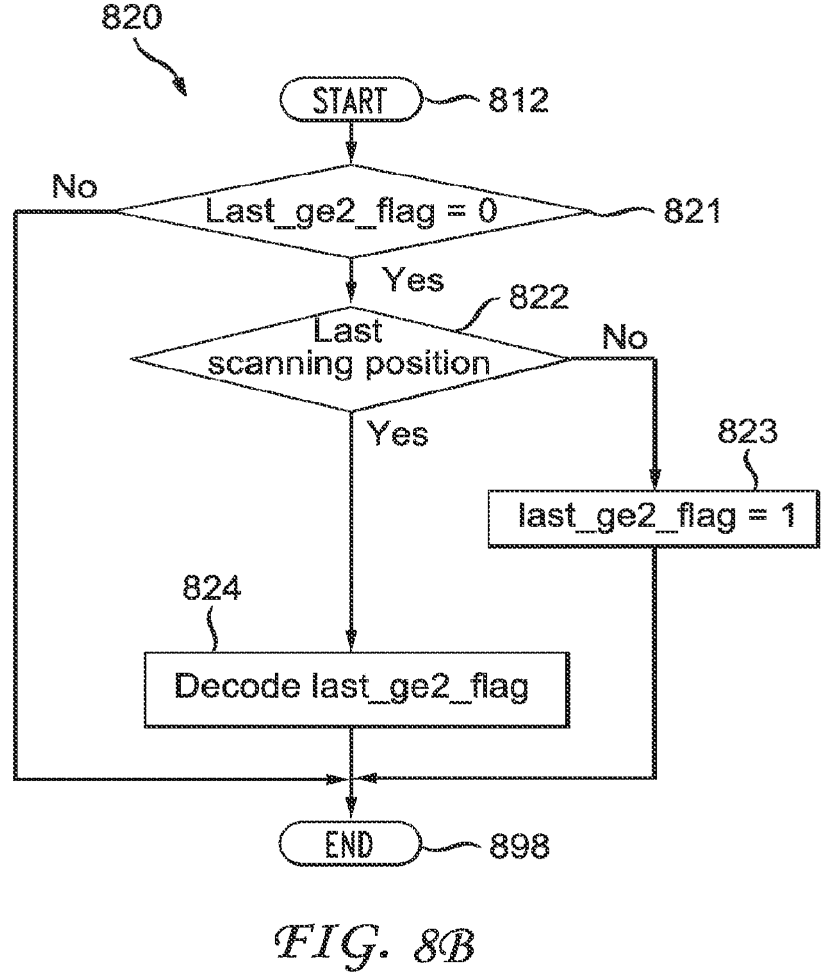
FIG. 8B is a flow diagram showing an exemplary method for decoding last_ge2_flag, in accordance with an embodiment of the present principles.

Turning to FIG. 8B, an exemplary method for decoding last_ge2_flag is indicated generally by the reference numeral 820. The method 820 includes a start block 812 that passes control to a decision block 821. The decision block 821 determines whether or not last_ge2_flag=0. If so, then control is passed to a decision block 822. Otherwise, control is passed to an end block 898. The decision block 822 determines whether or not the current scanning position is the last scanning position. If so, then control is passed to block 823. Otherwise, control is passed to a function block 824. The function block 723 sets last_ge2_flag=1, and passes control to the end block 898. The function block 824 decodes last_ge2_flag, and passes control to the end block 898.

Figure 8C:
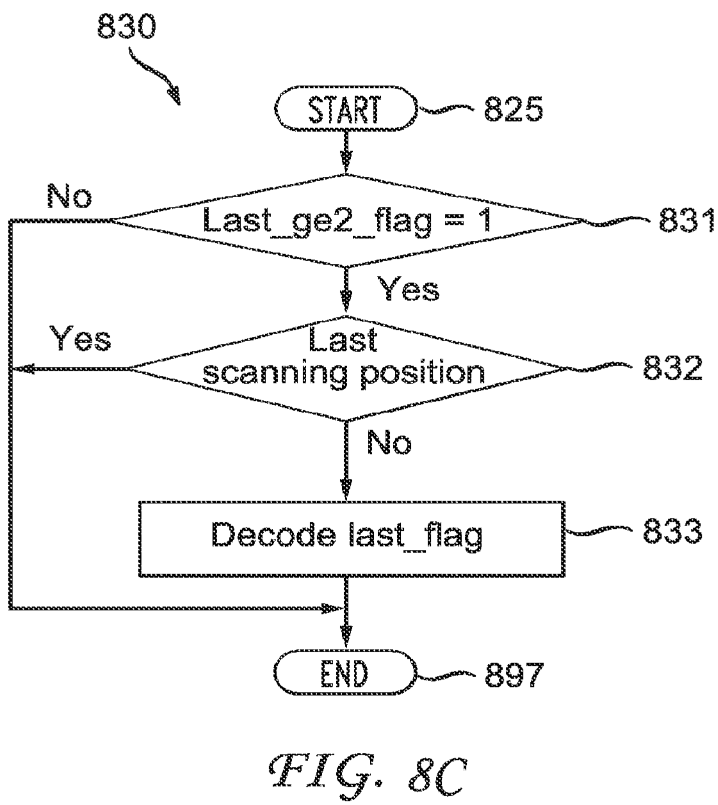
FIG. 8C is a flow diagram showing an exemplary method for decoding last_flag, in accordance with an embodiment of the present principles.

Turning to FIG. 8C, an exemplary method for decoding last_flag is indicated generally by the reference numeral 830. The method 830 includes a start block 825 that passes control to a decision block 831. The decision block 831 determines whether or not last_ge2_flag=1. If so, then control is passed to a decision block 832. Otherwise, control is passed to an end block 897. The decision block 832 determines whether or not the current scanning position is the last scanning position. If so, then control is passed to the end block 897. Otherwise, control is passed to a function block 833. The function block 833 decodes last_flag, and passes control to the end block 897.

Figure 8D:
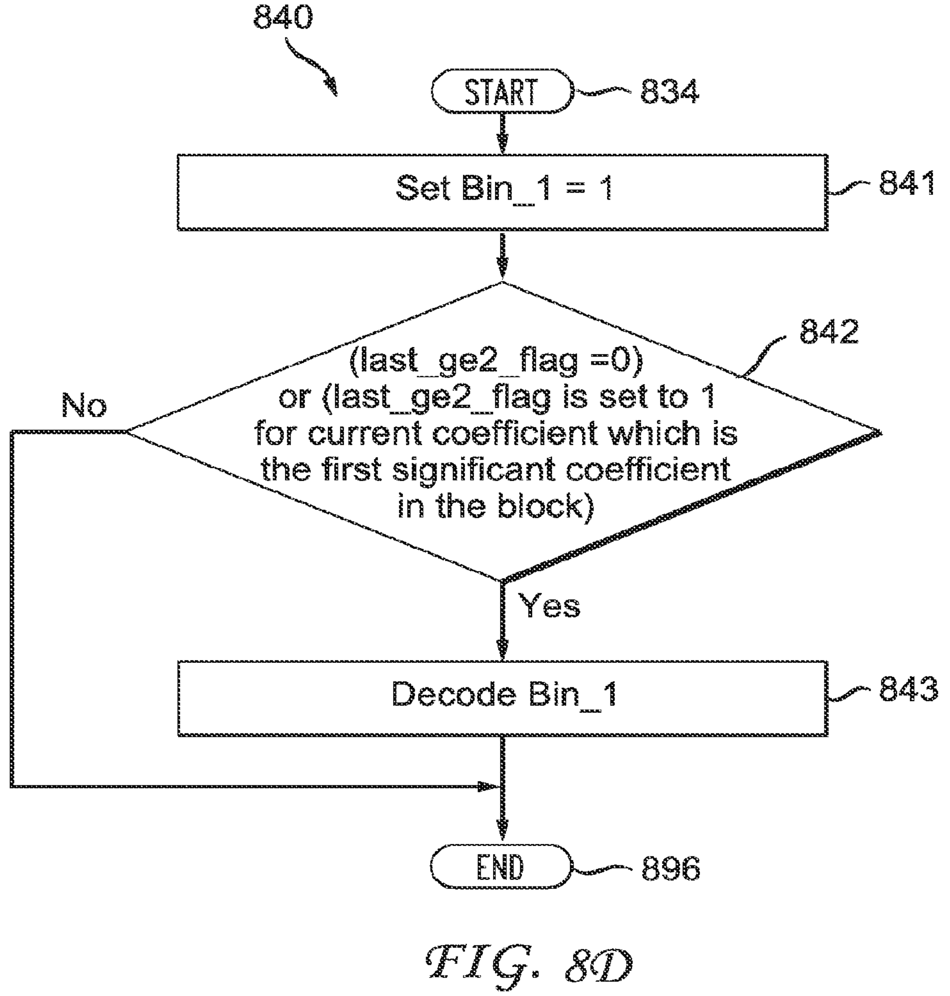
FIG. 8D is a flow diagram showing an exemplary method for decoding Bin_1, in accordance with an embodiment of the present principles.

Turning to FIG. 8D, an exemplary method for decoding Bin_1 is indicated generally by the reference numeral 840. The method 840 includes a start block 834 that passes control to a function block 841. The function block 841 sets Bin_1=1, and passes control to a decision block 842. The decision block 842 determines whether or not (last_ge2_flag=0) or (last_ge2_flag=1 for the current coefficient which is the first significant coefficient in the block). If so, then control is passed to a function block 843. Otherwise, control is passed to an end block 896. The function block 843 decodes Bin_1, and passes control to an end block 896.

Figure 8E:
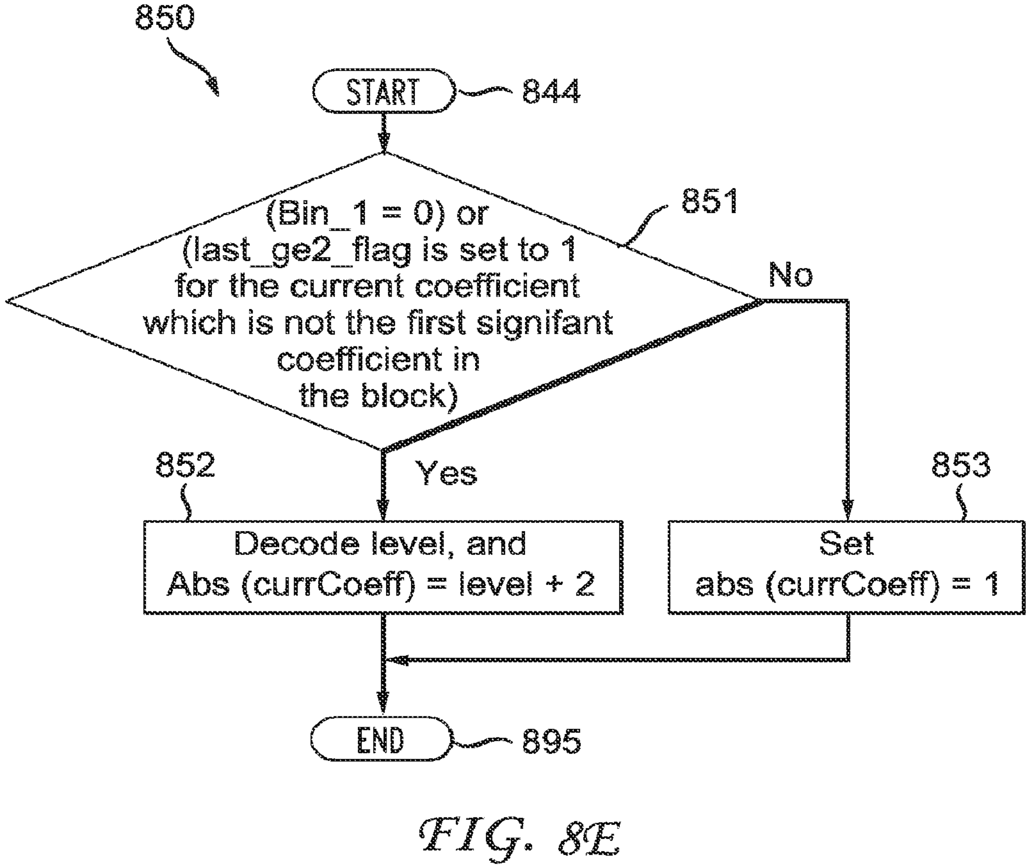
FIG. 8E is a flow diagram showing an exemplary method for decoding level, in accordance with an embodiment of the present principles.

Turning to FIG. 8E, an exemplary method for decoding level is indicated generally by the reference numeral 850. The method 850 includes a start block 844 that passes control to a decision block 851. The decision block 851 determines whether or not (Bin_1=0) or (last_ge2_flag=1 for the current coefficient which is not the first significant coefficient in the block). If so, then control is passed to a function block 852. Otherwise, control is passed to a function block 853. The function block 852 decodes level, and sets the absolute value of the current coefficient to level+2 (Abs (currCoeff)=level+2), and passes control to an end block 895. The function block 853 sets the absolute value of the current coefficient to 1 (abs (currCoeff))=1, and passes control to the end block 895.

Note there is special handling when decoding the coefficient in the last scanning position in the block.

- In the method 820, if the last_ge2_flag is still 0 before the last coefficient, then last_ge2_flag must be 1 for the last coefficient, so last_ge2_flag need not be decoded. Instead, it is just set to 1 as per the function block 823.
- In the method 830, similarly, if the last_flag is still 0 before the last coefficient, then last_flag must be 1 for the last coefficient, so last_flag need not be decoded.
- Bin_1 (per the method 840): Regarding the function block 842, if the last_ge2_flag is set to 1 for the last coefficient in 823 (even though it needs not be decoded by the function block 824) and it is the first significant coefficient in the block, then Bin_1 should be decoded by the function block 843.
- Level (per the method 850): In 851, if Bin_1=0 or if last_ge2_flag is set to 1 for the last coefficient by the function block 823 (even though it needs not be decoded by the function block 824) and the last coefficient is not the first significant coefficient, then level should be decoded by the function block 852. Otherwise, set the absolute value of this last coefficient to be 1 by the function block 853.

Another advantage of the proposed method is the coding of the coefficient level in the same scanning pass of the other syntaxes, such as the sig_flag, last_flag, and so forth. In CABAC, the coefficient level information is coded in the inverse zigzag scanning order, which can be seen as a second pass to code a block. In this inverse zigzag order coding, the level information can be coded with the context models designed with the inverse zigzag position of the coded coefficients. To be concrete, the first coded coefficient (in an inverse zigzag order) is coded with context model 0, the second coded coefficient is coded with context model 1, and so forth. This context model design shows some gains compared to the coding of the level bins with equal probable (0.5/0.5) models (i.e., output the bins directly with 1 bit per bin).

This small penalty can be easily compensated with the properly designed context models in the one pass coding method. Given the coefficient level information of the coded coefficients, the context models for the sig_flag, last_ge2_flag, last_flag, Bin_1, and the level bins can be designed based on the known level information from their coded neighbors to further improve the performance of the context models and achieve higher coding efficiency.

Figure 9:
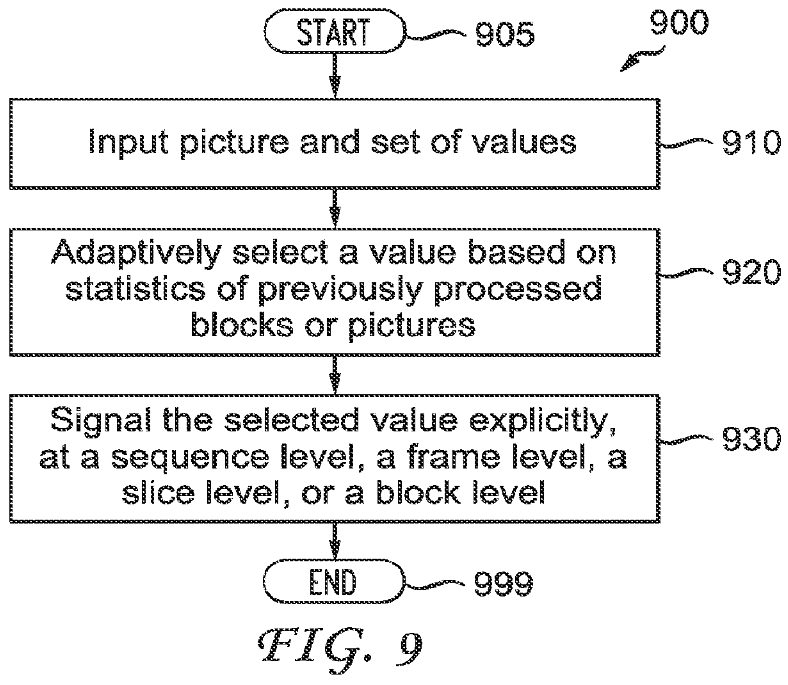
FIG. 9 is a flow diagram showing a method for selecting and signaling a value for a current transform coefficient, in accordance with an embodiment of the present principles.

Turning to FIG. 9, a method for selecting and signaling a value for a current transform coefficient is indicated generally by the reference numeral 900. The method 900 includes a start block 905 that passes control to a function block 910. The function block 910 inputs pictures and a set of values, and passes control to a function block 920. The function block 920 adaptively selects a value based on statistics of previously processed blocks or pictures, and passes control to a function block 930. The function block 930 signals the selected value explicitly at a sequence level, a frame level, a slice level, or a block level, and passes control to an end block 999.

Figure 10:
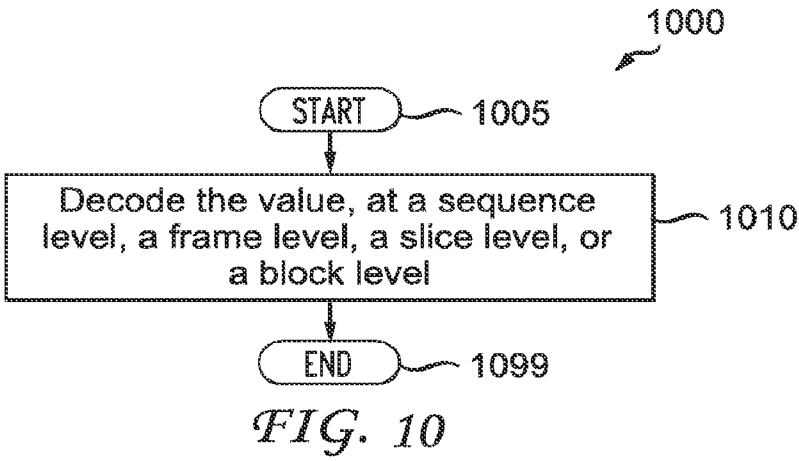
FIG. 10 is a flow diagram showing an exemplary method for decoding a value for a current transform coefficient, in accordance with an embodiment of the present principles.

Turning to FIG. 10, an exemplary method for decoding a value for a current transform coefficient is indicated generally by the reference numeral 1000. The method 1000 includes a start block 1005 that passes control to a function block 1010. The function block 1010 decodes the value at a sequence level, a frame level, a slice level, or a block level, and passes control to an end block 1099.

Thus, the present principles advantageously provide methods and apparatus for improved entropy encoding and decoding that systematically codes a quantized transform block. There are at least two novelties associated with this approach. First, the introduced last_ge2_flag reduces the binary bins to be binary arithmetic coded in the encoder and decoder and, thus, a simpler system is achieved. Second, coding of the coefficient value information in the same scanning order with the other syntaxes makes entropy coding of a block finished in one scanning pass. The value information can be used to improve the context models of the syntaxes to further achieve higher coding efficiency.

It is to be appreciated that last_ge2_flag is just an embodiment. As is readily apparent to one of ordinary skill in this and related arts, the flag can alternatively be referred to as last_geX_flag, where X is any number.

A description will now be given of some of the many attendant advantages/features of the present invention, some of which have been mentioned above. For example, one advantage/feature is an apparatus having a video encoder for encoding at least a block in a picture by transforming a residue of the block to obtain transform coefficients, quantizing the transform coefficients to obtain quantized transform coefficients, and entropy coding the quantized transform coefficients. The quantized transform coefficients are encoded in a single pass using a flag to indicate that a current one of the quantized transform coefficients being processed is a last non-zero coefficient for the block having a value greater than or equal to a specified value.

Another advantage/feature is the apparatus having the video encoder as described above, wherein the specified value is 2.

Yet another advantage/feature is the apparatus having the video encoder as described above, wherein subsequent non-zero coefficients from among the quantized transform coefficients having a value less than the specified value are encoded by encoding only the respective signs of the subsequent non-zero coefficients having the value less than the specified value.

Still another advantage/feature is the apparatus having the video encoder as described above, wherein the specified value is selected from among a plurality of values.

Moreover, another advantage/feature is the apparatus having the video encoder wherein the specified value is selected from among a plurality of values as described above, wherein the picture is one of a plurality of pictures included in a video sequence, and the specified value is adaptively selected responsive to derived statistics from previously processed blocks in the picture or in one or more other pictures from among the plurality of pictures in the video sequence.

Further, another advantage/feature is the apparatus having the video encoder as described above, wherein the specified value is explicitly signaled.

Also, another advantage/feature is the apparatus having the video encoder as described above, wherein the specified value is explicitly signaled at at least one of a sequence level, a frame level, a slice level, and a block level.

Additionally, another advantage/feature is the apparatus having the video encoder as described above, wherein a level of the current one of the quantized transform coefficients is encoded by subtracting the specified value from an actual value of the current one of the quantized transform coefficients to obtain a difference value and encoding the difference value as the level, in order to reproduce the level at a corresponding decoder by adding the difference value to the specified value.

Moreover, another advantage/feature is the apparatus having the video encoder as described above, wherein at least a sig_flag syntax element, the flag, a last_flag syntax element, a Bin_1 syntax element, a level syntax element, and a sign syntax element are encoded in a same scanning order, the sig_flag syntax element for indicating whether the current one of the quantized transform coefficients has a non-zero value, the last_flag for indicating whether the current one of the quantized transform coefficients having the non-zero value is a last quantized transform coefficient having the non-zero value in the block in a given scanning order, the Bin_1 syntax element for indicating that an absolute value of the current one of the quantized transform coefficients has a currently unknown non-zero value, the level syntax element for indicating an absolute value of the current one of the quantized transform coefficients when the current one of the quantized transform coefficients has the absolute value greater than the specified value, and the sign syntax element for indicating a corresponding sign of the current one of the quantized transform coefficients.

These and other features and advantages of the present principles may be readily ascertained by one of ordinary skill in the pertinent art based on the teachings herein. It is to be understood that the teachings of the present principles may be implemented in various forms of hardware, software, firmware, special purpose processors, or combinations thereof.

Most preferably, the teachings of the present principles are implemented as a combination of hardware and software. Moreover, the software may be implemented as an application program tangibly embodied on a program storage unit. The application program may be uploaded to, and executed by, a machine comprising any suitable architecture. Preferably, the machine is implemented on a computer platform having hardware such as one or more central processing units ("CPU"), a random access memory ("RAM"), and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and a printing unit.

It is to be further understood that, because some of the constituent system components and methods depicted in the accompanying drawings are preferably implemented in software, the actual connections between the system components or the process function blocks may differ depending upon the manner in which the present principles are programmed. Given the teachings herein, one of ordinary skill in the pertinent art will be able to contemplate these and similar implementations or configurations of the present principles.

Although the illustrative embodiments have been described herein with reference to the accompanying drawings, it is to be understood that the present principles is not limited to those precise embodiments, and that various changes and modifications may be effected therein by one of ordinary skill in the pertinent art without departing from the scope or spirit of the present principles. All such changes and modifications are intended to be included within the scope of the present principles as set forth in the appended claims.

The invention claimed is:

1. A method, comprising:

encoding at least a block in a picture by transforming a residue of the block to obtain transform coefficients, quantizing the transform coefficients to obtain quantized transform coefficients, and entropy coding the quantized transform coefficients, wherein the quantized transform coefficients are encoded using a first syntax element indicative of a corresponding one of the quantized transform coefficients being processed is a last non-zero coefficient for the block in a given scanning order having a value greater than or equal to a specified value, a second syntax element indicative of whether a corresponding quantized transform coefficients has an absolute value larger than two, a significance syntax element indicative of whether a corresponding one of the quantized transform coefficients has a non-zero value, a last syntax element indicative of a position of a last coefficient having non-zero value, a level syntax element indicative of an absolute value of a corresponding one of the quantized transform coefficients when the corresponding one of the quantized transform coefficients has the absolute value greater than the specified value, and wherein the specified value is one of a plurality of values, and wherein the first syntax element, the second syntax element, the significance syntax element, the last syntax element, and the level syntax element, are encoded in the given scanning order.

2. The method of claim 1, wherein subsequent non-zero coefficients from among the quantized transform coefficients having a value less than the specified value are encoded by encoding only respective signs of the subsequent non-zero coefficients having the value less than the specified value.

3. The method of claim 1, wherein the picture is one of a plurality of pictures comprised in a video sequence, and the specified value is adaptively selected responsive to derived statistics from previously processed blocks in the picture or in one or more other pictures from among the plurality of pictures in the video sequence.

4. The method of claim 1, wherein a level of the corresponding one of the quantized transform coefficients is encoded by subtracting the specified value from an actual value of the corresponding one of the quantized transform coefficients to obtain a difference value and encoding the difference value as the level, in order to reproduce the level at a corresponding decoder by adding the difference value to the specified value.

5. The method of claim 1, wherein at least the significance _ syntax element, the, the last syntax element syntax element, a Bin_1 syntax element, the level syntax element, and the significance n syntax element are encoded in a same scanning order, the significance _ syntax element for indicating whether the corresponding one of the quantized transform coefficients has a non-zero value, the last syntax element for indicating whether the corresponding one of the quantized transform coefficients having the non-zero value is a last quantized transform coefficient having the non-zero value in the block in a given scanning order, the Bin_1 syntax element for indicating that an absolute value of the corresponding one of the quantized transform coefficients has a correspondingly unknown non-zero value, the level syntax element for indicating an absolute value of the corresponding one of the quantized transform coefficients when the corresponding one of the quantized transform coefficients has the absolute value greater than the specified value, and the significance n syntax element for indicating a corresponding significance n of the corresponding one of the quantized transform coefficients.

6. An apparatus, comprising:

a memory, and a processor, configured to perform:

encoding at least a block in a picture by transforming a residue of the block to obtain transform coefficients, quantizing the transform coefficients to obtain quantized transform coefficients, and entropy coding the quantized transform coefficients, wherein the quantized transform coefficients are encoded using a first syntax element indicative of a corresponding one of the quantized transform coefficients being processed is a last non-zero coefficient for the block in a given scanning order having a value greater than or equal to a specified value, a second syntax element indicative of whether a corresponding quantized transform coefficients has an absolute value larger than two, a significance syntax element indicative of whether a corresponding one of the quantized transform coefficients has a non-zero value, a last syntax element indicative of a position of a last coefficient having non-zero value, a level syntax element indicative of an absolute value of a corresponding one of the quantized transform coefficients when the corresponding one of the quantized transform coefficients has the absolute value greater than the specified value, and wherein the specified value is one of a plurality of values, and wherein the first syntax element, the second syntax element, the significance syntax element, the last syntax element, and the level syntax element.

7. The apparatus of claim 6, wherein subsequent non-zero coefficients from among the quantized transform coefficients having a value less than the specified value are encoded by encoding only respective signs of the subsequent non-zero coefficients having the value less than the specified value.

8. The apparatus of claim 6, wherein the picture is one of a plurality of pictures comprised in a video sequence, and the specified value is adaptively selected responsive to derived statistics from previously processed blocks in the picture or in one or more other pictures from among the plurality of pictures in the video sequence.

9. The apparatus of claim 6, wherein a level of the corresponding one of the quantized transform coefficients is encoded by subtracting the specified value from an actual value of the corresponding one of the quantized transform coefficients to obtain a difference value and encoding the difference value as the level, in order to reproduce the level at a corresponding decoder by adding the difference value to the specified value.

10. The apparatus of claim 6, wherein at least the significance _ syntax element, the, the last syntax element syntax element, a Bin_1 syntax element, the level syntax element, and the significance n syntax element are encoded in a same scanning order, the significance _ syntax element for indicating whether the corresponding one of the quantized transform coefficients has a non-zero value, the last syntax element for indicating whether the corresponding one of the quantized transform coefficients having the non-zero value is a last quantized transform coefficient having the non-zero value in the block in a given scanning order, the Bin_1 syntax element for indicating that an absolute value of the corresponding one of the quantized transform coefficients has a correspondingly unknown non-zero value, the level syntax element for indicating an absolute value of the corresponding one of the quantized transform coefficients when the corresponding one of the quantized transform coefficients has the absolute value greater than the specified value, and the significance n syntax element for indicating a corresponding significance n of the corresponding one of the quantized transform coefficients.

11. A method, comprising:

decoding at least a block in a picture by entropy decoding quantized transform coefficients, de-quantizing the quantized transform coefficients to obtain transform coefficients, and inverse transforming the transform coefficients to obtain a residue of the block for use in reconstructing the block, wherein the quantized transform coefficients are decoded using a first syntax element indicating that one of the quantized transform coefficients being processed is a last non-zero coefficient for the block in a given scanning order having a value greater than or equal to a specified value, a second syntax element indicative of whether a corresponding quantized transform coefficient has an absolute value larger than two, a significance syntax element indicative of whether a corresponding one of the quantized transform coefficients has a non-zero value, a last syntax element indicative of a position of a last coefficient having non-zero value, a level syntax element indicative of an absolute value of a corresponding one of the quantized transform coefficients when the corresponding one of the quantized transform coefficients has the absolute value greater than the specified value, and wherein the specified value is one of a plurality of values, and wherein the first syntax element, the second syntax element, the significance syntax element, the last syntax element, and the level syntax element.

12. The method of claim 11, wherein subsequent non-zero coefficients from among the quantized transform coefficients having a value less than the specified value are decoded by decoding only respective signs of the subsequent non-zero coefficients having the value less than the specified value.

13. The method of claim 11, wherein a level of the corresponding one of the quantized transform coefficients is decoded by decoding a difference value previously determined between an actual value of the corresponding one of the quantized transform coefficients and the specified value, and adding the difference value to the specified value to obtain the level.

14. The method of claim 11, wherein at least the significance _ syntax element, the last syntax element syntax element, a Bin_1 syntax element, the level syntax element, and the significance n syntax element are encoded in a same scanning order, the significance _ syntax element for indicating whether the corresponding one of the quantized transform coefficients has a non-zero value, the last syntax element for indicating whether the corresponding one of the quantized transform coefficients having the non-zero value is a last quantized transform coefficient having the non-zero value in the block in a given scanning order, the Bin_1 syntax element for indicating that an absolute value of the corresponding one of the quantized transform coefficients has a correspondingly unknown non-zero value, the level syntax element for indicating an absolute value of the corresponding one of the quantized transform coefficients when the corresponding one of the quantized transform coefficients has the absolute value greater than the specified value, and the significance n syntax element for indicating a corresponding significance n of the corresponding one of the quantized transform coefficients.

15. An apparatus, comprising:

a memory, and a processor, configured to perform:

decoding at least a block in a picture by entropy decoding quantized transform coefficients, de-quantizing the quantized transform coefficients to obtain transform coefficients, and inverse transforming the transform coefficients to obtain a residue of the block for use in reconstructing the block, wherein the quantized transform coefficients are decoded using a first syntax element indicating that one of the quantized transform coefficients being processed is a last non-zero coefficient for the block in a given scanning order having a value greater than or equal to a specified value, a second syntax element indicative of whether a corresponding quantized transform coefficient has an absolute value larger than two, a significance syntax element indicative of whether a corresponding one of the quantized transform coefficients has a non-zero value, a last syntax element indicative of a position of a last coefficient having non-zero value, a level syntax element indicative of an absolute value of a corresponding one of the quantized transform coefficients when the corresponding one of the quantized transform coefficients has the absolute value greater than the specified value, and wherein the specified value is one of a plurality of values, and wherein the first syntax element, the second syntax element, the significance syntax element, the last syntax element, the level syntax element are encoded in the given scanning order.

16. The apparatus of claim 15, wherein subsequent non-zero coefficients from among the quantized transform coefficients having a value less than the specified value are decoded by decoding only respective signs of the subsequent non-zero coefficients having the value less than the specified value.

17. The apparatus of claim 15, wherein a level of the corresponding one of the quantized transform coefficients is decoded by decoding a difference value previously determined between an actual value of the corresponding one of the quantized transform coefficients and the specified value, and adding the difference value to the specified value to obtain the level.

18. The apparatus of claim 15, wherein at least the significance _ syntax element, the last syntax element syntax element, a Bin_1 syntax element, the level syntax element, and the significance n syntax element are encoded in a same scanning order, the significance _ syntax element for indicating whether the corresponding one of the quantized transform coefficients has a non-zero value, the last syntax element for indicating whether the corresponding one of the quantized transform coefficients having the non-zero value is a last quantized transform coefficient having the non-zero value in the block in a given scanning order, the Bin 1 syntax element for indicating that an absolute value of the corresponding one of the quantized transform coefficients has a correspondingly unknown non-zero value, the level syntax element for indicating an absolute value of the corresponding one of the quantized transform coefficients when the corresponding one of the quantized transform coefficients has the absolute value greater than the specified value, and the significance n syntax element for indicating a corresponding significance n of the corresponding one of the quantized transform coefficients.

19. A non-transitory computer readable storage media having instructions stored therein, which when executed by a processor, implement a method comprising:

decoding at least a block in a picture by entropy decoding quantized transform coefficients, de-quantizing the quantized transform coefficients to obtain transform coefficients, and inverse transforming the transform coefficients to obtain a residue of the block for use in reconstructing the block, and wherein a flag indicates that one of the quantized transform coefficients being processed being a last non-zero coefficient for the block having a value greater than or equal to a specified value, wherein the specified value is one of a plurality of values, said specified value remains fixed for the block, and said flag is a syntax element.

20. The non-transitory computer readable storage medium of claim 19, wherein subsequent non-zero coefficients from among the quantized transform coefficients having a value less than the specified value are decoded by decoding only respective signs of the subsequent non-zero coefficients having the value less than the specified value.

* * * * *